US009431391B2

United States Patent
Ueno

(10) Patent No.: US 9,431,391 B2
(45) Date of Patent: Aug. 30, 2016

(54) GALLIUM NITRIDE HEMT DEVICE WITH A MOSFET IN SERIES COUPLED TO DIODES FOR PROTECTION OF HIGH-VOLTAGE

(71) Applicants: FURUKAWA ELECTRIC CO., LTD., Tokyo (JP); FUJI ELECTRIC CO., LTD., Kawasaki-shi (JP)

(72) Inventor: Katsunori Ueno, Kanagawa (JP)

(73) Assignees: Furukawa Electric Co., Ltd., Tokyo (JP); Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/023,797

(22) Filed: Sep. 11, 2013

(65) Prior Publication Data

US 2014/0346570 A1 Nov. 27, 2014

(30) Foreign Application Priority Data

May 22, 2013 (JP) .................... 2013-108304

(51) Int. Cl.
*H01L 29/74* (2006.01)
*H01L 27/06* (2006.01)
*H01L 27/02* (2006.01)

(52) U.S. Cl.
CPC ....... *H01L 27/0605* (2013.01); *H01L 27/0255* (2013.01); *H01L 27/0266* (2013.01)

(58) Field of Classification Search
CPC ........... H01L 27/0248; H01L 27/0255; H01L 27/0629; H01L 27/088; H01L 27/0266; H01L 29/778; H01L 29/861; H01L 29/2003
USPC .................................. 257/192–195
See application file for complete search history.

(56) References Cited

U.S. PATENT DOCUMENTS

| | | | |
|---|---|---|---|
| 6,434,019 B2* | 8/2002 | Baudelot | 363/16 |
| 7,470,958 B2* | 12/2008 | Hirose et al. | 257/355 |
| 7,768,758 B2* | 8/2010 | Maier | H03K 17/08148 335/18 |
| 8,084,783 B2* | 12/2011 | Zhang | H01L 27/0605 257/109 |
| 8,681,518 B2* | 3/2014 | Callanan | H03K 17/0406 363/53 |
| 8,958,189 B1* | 2/2015 | Weyers et al. | 361/91.5 |
| 2006/0113593 A1* | 6/2006 | Sankin | H01L 27/098 257/341 |
| 2009/0167411 A1* | 7/2009 | Machida et al. | 327/427 |
| 2012/0241820 A1* | 9/2012 | Briere et al. | 257/195 |
| 2012/0280271 A1* | 11/2012 | Ichikawa | H03K 17/107 257/133 |
| 2012/0292635 A1* | 11/2012 | Iketani | H01L 27/0629 257/76 |
| 2013/0009613 A1* | 1/2013 | Honea et al. | 323/205 |
| 2013/0088280 A1* | 4/2013 | Lal et al. | 327/513 |

OTHER PUBLICATIONS

J. Kuzmik, et al., "Electrostatic discharge effects in AlGaN/GaN high-electron-mobility transistors", Applied Physics Letters, vol. 83, No. 22, Dec. 1, 2003, pp. 4655-4657.

* cited by examiner

*Primary Examiner* — Jessie Y Miyoshi
*Assistant Examiner* — Stephen C Smith
(74) *Attorney, Agent, or Firm* — Oblon, McClelland, Maier & Neustadt, L.L.P.

(57) ABSTRACT

A semiconductor device having high breakdown withstand voltage includes a first element which is a normally-on type transistor made of nitride compound semiconductor, a second element which is connected to the first element in series and is a transistor having withstand voltage between a source and a drain lower than withstand voltage of the first element, a first diode which is connected between a gate of the first element or a gate of the second element and a drain of the first element so that a cathode of the first diode is connected at the drain's side and has predetermined avalanche withstand voltage, and a first resistance connected to the gate to which the first diode is connected. The avalanche withstand voltage of the first diode is lower than breakdown voltage of the first element.

3 Claims, 7 Drawing Sheets

GALLIUM NITRIDE HEMT DEVICE WITH A MOSFET IN SERIES COUPLED TO DIODES FOR PROTECTION OF HIGH-VOLTAGE

CROSS-REFERENCE TO RELATED APPLICATION(S)

This application is based upon and claims the benefit of priority from the prior Japanese Patent Application No. 2013-108304, filed on May 22, 2013; the entire contents of which are incorporated herein by reference.

BACKGROUND OF THE INVENTION

1. Field of the Invention

The present invention relates to a semiconductor device.

2. Description of the Related Art

Conventionally, as a semiconductor material, nitride-based compound semiconductor, for example, gallium nitride (GaN)-based compound semiconductor is used for semiconductor elements (hereinafter GaN-based semiconductor elements) for use in high-frequency devices. In the GaN-based semiconductor element, a buffer layer or a doped GaN layer formed by using, for example, Metal Organic Chemical Vapor Deposition (MOCVD) method is provided on a surface of a semiconductor substrate. Recently, based on the recognition of being applicable to power devices for electric power use in addition to high frequency use, a device to which high voltage or large electric current is applied is also under research and development.

High electron mobility transistor (HEMT) is a kind of GaN-based semiconductor element. For example, HEMT has a configuration in which a GaN layer and an aluminum gallium nitride (AlGaN) layer are grown. A two-dimensional electron gas (2 DEG) is generated at an interface of the GaN layer with the AlGaN layer. Carrier density of the 2 DEG can be controlled by adjusting the Al composition ratio and the thickness of the AlGaN layer. In HEMT, the 2 DEG layer becomes an electric-current-flowing path. In addition, in HEMT, a gate electrode having Schottky characteristics with respect to the AlGaN layer is disposed on a part of a surface of the AlGaN layer, and the path made of the 2 DEG layer is switched on and off by controlling gate voltage. A type of HEMT in which the path between the source and the drain becomes conductive when the gate voltage is 0 V is called normally-on type. On the other hand, a type of HEMT in which the path between the source and the drain is not conductive when the gate voltage is 0 V and the path becomes conductive when the gate voltage becomes positive voltage is called a normally-off type. Hereinafter, HEMT etc. made of GaN-based compound semiconductor is called GaN-HEMT etc.

In some cases, an element used in an application circuit is required to be normally-off type from a viewpoint of safe operation of the application circuit. In order to make HEMT normally off type, there is a technique of eliminating a 2 DEG layer partly by injecting ion of fluorine etc. or radiating plasma immediately under a gate electrode, or making the thickness of the AlGaN layer immediately under the gate electrode partly thinner by etching etc. Also, in order to prevent gate leakage, there is a case in which an insulating film is provided under the gate electrode. In normally-off type of HEMT, when the gate is in off state and voltage is applied between the source and the drain, the 2 DEG layer is depleted from a gate end and high withstand voltage can be maintained. Accordingly, since HEMT functions as a high withstand voltage semiconductor element for use with large electric power, research and development for HEMT, as a high frequency and high efficiency semiconductor element for electric power use, are in progress actively in recent years. Also, research and development for high withstand voltage Schottky barrier diode (SBD) using a 2 DEG layer as a conductive layer are in progress in a similar manner.

In order to be used as a semiconductor element for electric power use, high speed operation and low conductive resistance as explained above are great advantages. On the other hand, high reliability that the element will not be broken even various load is applied is required for a semiconductor element for electric power use. There is avalanche tolerance (avalanche withstand voltage) as one of basic characteristics of a semiconductor element. Avalanche tolerance indicates tolerability where an element will not be broken until a predetermined electric current even when voltage equal to or greater than avalanche tolerance is applied to the element and when the element breaks down between the source and the drain due to avalanche breakdown. For example, in J. Kuzmik et al., "Electrostatic discharge effects in AlGaN/GaN high electron mobility transistors", Applied Physics Letters, Vol. 83, No. 22, 2003, pp. 4655-4657. (hereinafter to be referred to as Document 1), a so-called transmission line pulser (TLP) measurement in which current-voltage characteristics when a voltage stress is applied in short period of time is studied for GaN-HEMT. In this case, the avalanche tolerance of the GaN-HEMT is considered to be low because the GaN-HEMT leads to breakdown without avalanche breakdown after negative resistance occurs rapidly at a certain voltage.

A phenomenon called as collapse is considered to be another problem of GaN-HEMT. Collapse is a phenomenon where, when high voltage is applied to an element, forward resistance increases to a degree, for example, several times as much as an initial value. If collapse occurs, electric power loss in the element increases.

SUMMARY OF THE INVENTION

It is an object of the present invention to at least partially solve the problems in the conventional technology.

In accordance with one aspect of the present invention, a semiconductor device includes a first element which is a normally-on type transistor made of nitride compound semiconductor, a second element which is connected to the first element in series and is a transistor having withstand voltage between a source and a drain which is lower than withstand voltage of the first element, a first diode which is connected between a gate of the first element or a gate of the second element and a drain of the first element so that a cathode of the first diode is connected at the drain's side and has predetermined avalanche withstand voltage, and a first resistance connected to the gate to which the first diode is connected. The avalanche withstand voltage of the first diode is lower than breakdown voltage of the first element.

In accordance with another aspect of the present invention, a semiconductor device includes a first element which is a normally-on type transistor made of nitride-based compound semiconductor, a second element which is connected to the first element in series and is a diode having withstand voltage between an anode and a cathode which is lower than withstand voltage of the first element, a first diode which is connected between a gate of the first element and the drain of the first element so that a cathode of the first diode is connected at the drain's side and has predetermined avalanche withstand voltage, and a first resistance connected between the gate of the first element and the anode of the second element. The avalanche withstand voltage of the first diode is lower than breakdown voltage of the first element.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
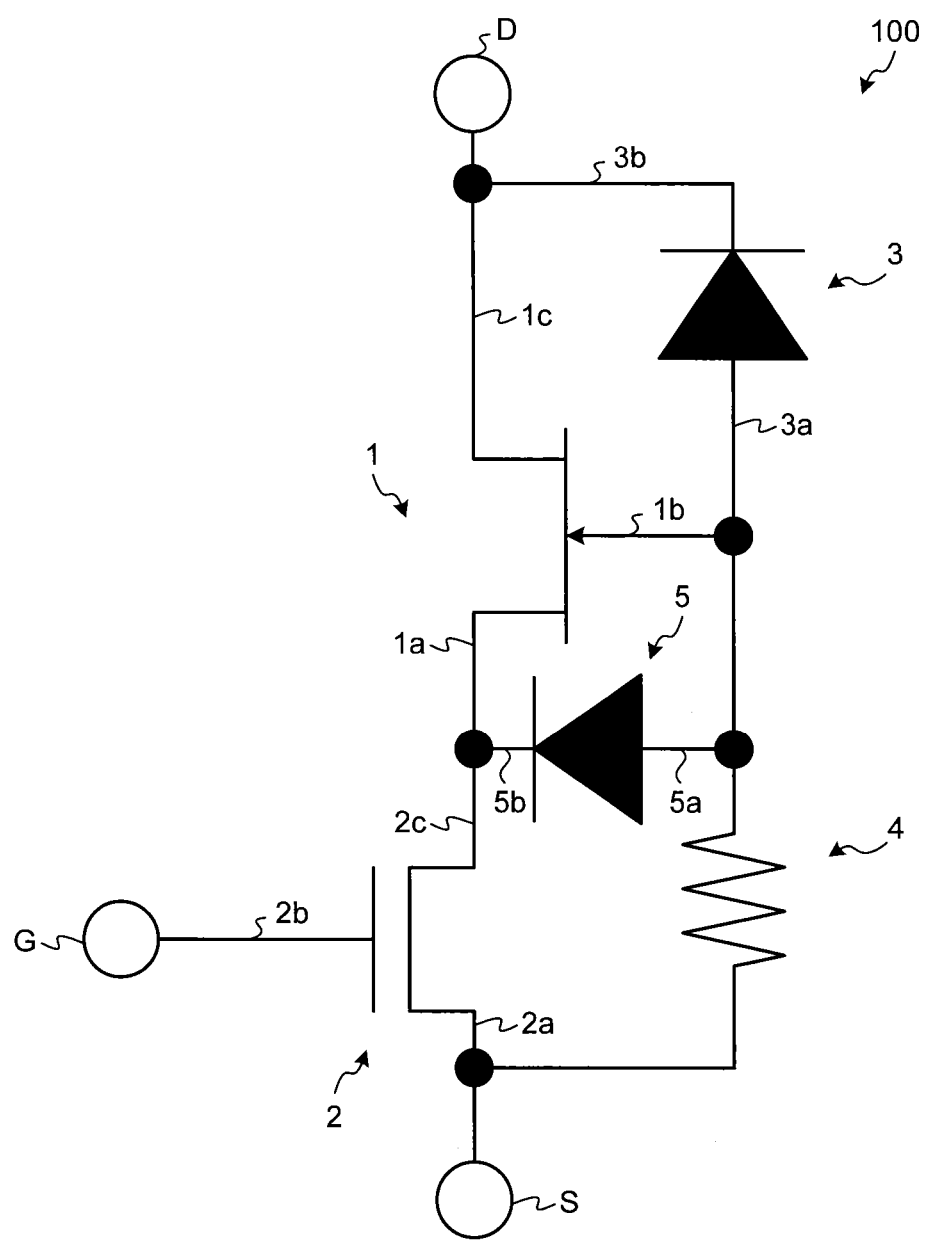
FIG. 1 is a circuit diagram of a semiconductor device according to an embodiment 1.

Hereinafter, embodiments of a semiconductor device according to the present invention will be explained in detail with reference to drawings. It should be noted that the present invention is not limited by these embodiments. Also, in the drawings, if deemed appropriate, identical or corresponding elements are given same reference numerals. In addition, it should be noted that the drawings are schematic depictions, and do not represent the actual relation etc. of dimension of each element. Furthermore, different drawings may include portions using different scales and dimensional relations.

Document 1 discloses characteristics of GaN-HEMT. When the inventors of the present invention conducted TLP measurement to GaN-SBD in a similar manner to Document 1, rapid negative resistance characteristics were confirmed and the GaN-SBD broke down substantially instantaneously without avalanche breakdown in a similar manner to the case of Document 1.

Since a large current element has a relatively large device size, if they have such negative-resistance characteristics, a great amount of electric current is concentrated to a very limited area relative to the whole size, and the element breaks down instantaneously. For example, although an element is required to have electrostatic discharge (ESD) tolerance which prevents breakdown of the element even if over-voltage is applied in short period of time, it is difficult to obtain sufficient ESD tolerance in the above explained characteristics of low avalanche tolerance.

Figure 9:
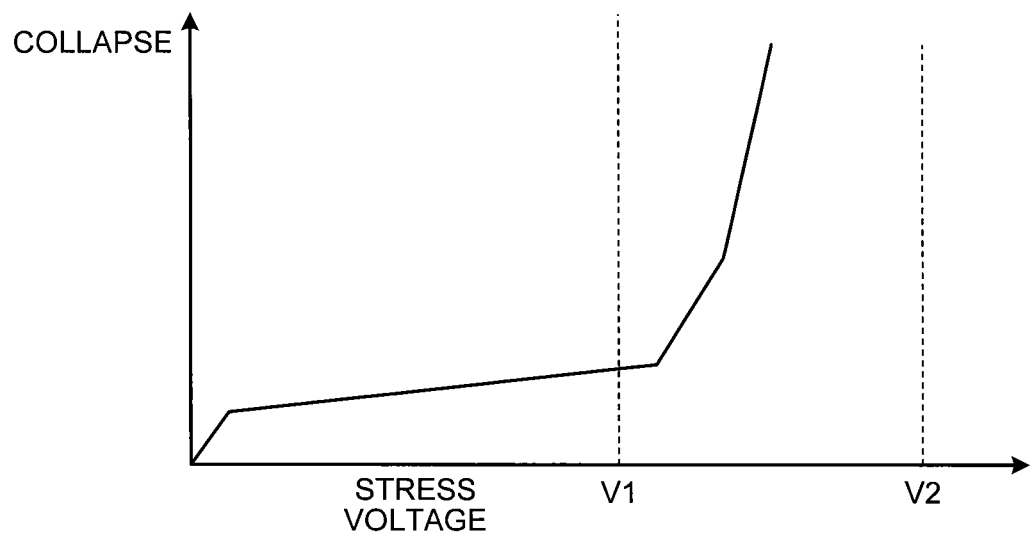
FIG. 9 is a view showing a relation between stress voltage and collapse.

FIG. 9 is a view showing a relation between stress voltage and collapse in GaN-HEMT. The horizontal axis indicates stress voltage between the source and the drain, and the vertical axis indicates the degree of collapse. Herein the degree of collapse is indicated by, for example, a ratio, relative to an initial value of the forward resistance, of forward resistance increased by collapse.

As shown in FIG. 9, when stress voltage increases, collapse rapidly increases at a certain voltage V1. Such voltage V1 is called collapse-increasing voltage. Also, if the stress voltage increases further, the element breaks down at breakdown voltage V2. In the GaN-HEMT, when over-voltage caused by surge or electrostatic discharge and being higher than the collapse-increasing voltage V1 is applied, collapse rapidly increases, and when higher over-voltage is further applied, the GaN-HEMT breaks down instantaneously at the breakdown voltage V2 without avalanche breakdown.

In contrast to this, since a semiconductor device according to embodiments which will be explained below can restrain increase in resistance caused by collapse and has high breakdown tolerance, reliability of the semiconductor device becomes high.

FIG. 1 is a circuit diagram of the semiconductor device according to the embodiment 1 of the present invention. As shown in FIG. 1, the semiconductor device 100 includes a first element 1, a second element 2, a first diode 3, a first resistance 4, a protection diode 5, a source terminal S, a gate terminal G, and a drain terminal D.

Figure 2:
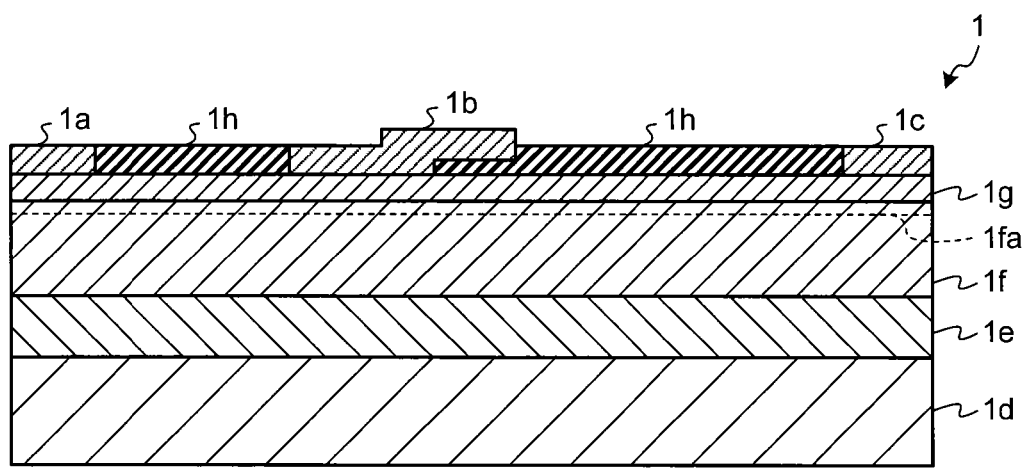
FIG. 2 is a schematic cross-sectional view of HEMT which is a first element constituting the semiconductor device shown in FIG. 1.

The first element 1 is a normally-on type HEMT made of nitride-based compound semiconductor, and includes a source electrode 1a, a gate electrode 1b, and a drain electrode 1c. FIG. 2 is a schematic cross-sectional view of HEMT which is the first element 1. As shown in FIG. 2, the first element 1 has a structure in which a buffer layer 1e made of nitride-based compound semiconductor, a GaN layer 1f which is an electron transit layer, and an AlGaN layer 1g which is an electron-supplying layer and has bandgap wider than that of GaN, are grown in this order on a substrate 1d made of, for example, silicon. On the AlGaN layer 1g, the gate electrode 1b making Schottky contact with the AlGaN layer 1g, and the source electrode 1a and the drain electrode 1c both of which make ohmic contact with the AlGaN layer 1g are formed. The source electrode 1a and the drain electrode 1c are disposed to place the gate electrode 1b therebetween. An area of a surface, on which neither the source electrode 1a, the gate electrode 1b, nor the drain electrode 1c is formed, of the AlGaN layer 1g is protected by a passivation film 1h made of, for example, SiN.

A 2 DEG layer 1fa is formed at an interface of the GaN layer 1f with the AlGaN layer 1g. By this structure, HEMT which is the first element 1 operates as a normally-on type of HEMT. The first element 1 herein is a high withstand voltage element having the withstand voltage between the source and the drain of, for example, equal to or greater than 200 V.

The second element 2 is a transistor such as metal oxide semiconductor (MOS) type of field effect transistor (FET) etc. made of, for example, silicon-based semiconductor material, and includes a source electrode 2a, a gate electrode 2b, and a drain electrode 2c. The second element 2 is a low withstand voltage element of which the withstand voltage between the source and the drain is equal to or lower than, for example, 50 V and is lower than the withstand voltage of the first element 1. The drain electrode 2c is connected to the source electrode 1a of the first element 1. That is, the first element 1 and the second element 2 are connected in series.

The first diode 3 includes an anode electrode 3a and a cathode electrode 3b, and is connected between the gate electrode 1b and the drain electrode 1c of the first element 1 so that the cathode electrode 3b is connected at the drain electrode 1c's side. The first diode 3 has a predetermined avalanche withstand voltage of, for example, roughly 600 V. The first diode 3 may be a P-N junction diode or a Schottky diode, but is not limited specifically.

The first resistance 4 which is a gate resistance is connected between the gate electrode 1b of the first element 1 and the source electrode 2a of the second element 2, and herein the gate electrode 1b is the gate electrode to which the first diode 3 is connected. As explained above, the semiconductor device 100 includes a configuration of cascode connection in which the first element 1 and the second element 2 are connected in series, and the gate electrode 1b of the first element 1 and the source electrode 2a of the second element 2 are connected.

The protection diode 5 includes an anode electrode 5a and a cathode electrode 5b, and is connected between the gate electrode 1b and the source electrode 1a of the first element so that the cathode electrode 5b is connected at the source electrode 1a's side.

The source terminal S is connected to the source electrode 2a of the second element 2, the gate terminal G is connected to the gate electrode 2b of the second element 2, and the drain terminal D is connected to the drain electrode 1c of the first element 1. The source terminal S, the gate terminal G, and the drain terminal D are, as terminals of the entire semiconductor device 100, connected to outside. For example, the gate terminal G is connected to a gate-driving circuit disposed outside.

The operation of the semiconductor device 100 will be described. At first, a case in which forward voltage is applied to an interval between the source terminal S and the drain terminal D will be described. Since, in a state in which gate voltage is not applied to the gate terminal G, the second element 2 is in off-state, electric current does not flow between the source terminal S and the drain terminal D, thus, the semiconductor device 100 is in off-state. After that, when gate voltage equal to or greater than a threshold is applied to the gate terminal G, the second element 2 turns into on-state, and electric current flows between the source terminal S and the drain terminal D. As described above, the semiconductor device 100 operates as a normally-off type of FET.

Next, a case in which reverse voltage is applied between the source terminal S and the drain terminal D of the semiconductor device 100 will be described. When reverse voltage increases, reverse voltage is applied also between the anode electrode 3a and the cathode electrode 3b of the first diode 3. After that, when the anode-cathode voltage of the first diode 3 exceeds avalanche withstand voltage, the first diode 3 breaks down, and avalanche current flows from the cathode electrode 3b to the anode electrode 3a. The avalanche current flows also to the first resistance 4 which is a gate resistance. Then, voltage drop occurs due to the first resistance 4, and gate voltage is applied to the gate electrode 1b of the first element 1. When the gate voltage becomes equal to or greater than a threshold, the first element 1 turns into on-state. Since, in this state, the protection diode 5 is connected between the gate electrode 1b and the source electrode 1a, forward current is not to flow in the gate electrode 1b.

When the first element 1 turns into on-state as described above, reverse voltage applied between the source and the drain of the second element 2 increases, the second element 2 breaks down between the source and the drain, and thus, electric current flows between the source and the drain. As a result, higher reverse voltage is not applied between the source and the drain of the first element 1.

In the semiconductor device 100, the avalanche withstand voltage of the first diode 3 is set to be lower than the breakdown voltage and the collapse-increasing voltage of the first element 1. As a result, even if reverse voltage is applied to the semiconductor device 100, the first diode 3 breaks down and the second element 2 also breaks down before voltage greater than the collapse-increasing voltage is applied to the first element 1, thus, reverse voltage greater than the collapse-increasing voltage is not applied between the source and the drain of the first element 1.

Figure 3:
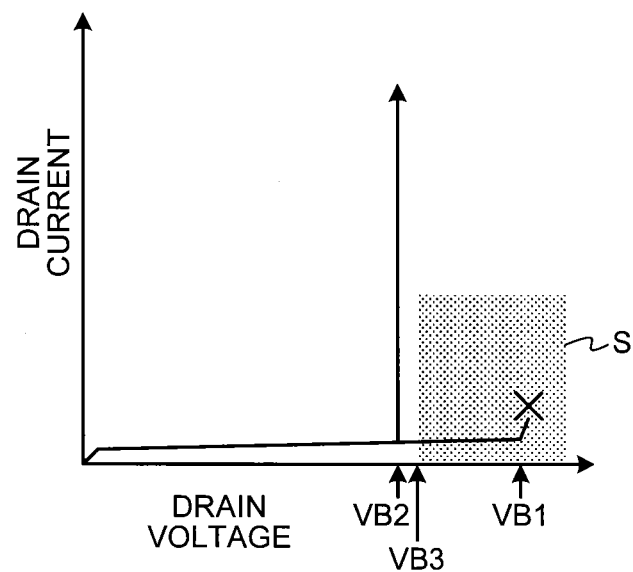
FIG. 3 is a view explaining characteristics of the semiconductor device shown in FIG. 1.

FIG. 3 is a view explaining characteristics of the semiconductor device 100. The horizontal axis indicates drain voltage, and the vertical axis indicates drain current. An area S indicates an area in which collapse of the first element 1 increases. VB1 indicates breakdown voltage of the first element 1, VB2 indicates avalanche withstand voltage of the first diode 3, and VB3 indicates collapse-increasing voltage of the first element.

If there is no first diode 3, and if reverse voltage is applied between the source terminal S and the drain terminal D of the semiconductor device 100, drain voltage reaches the collapse-increasing voltage of the first element 1, and the collapse of the first element 1 increases rapidly. If the drain voltage increases further and reaches the breakdown voltage of the first element 1, the first element 1 breaks down.

However, in the semiconductor device 100 according to the present embodiment 1, the first diode 3 breaks down before the drain voltage reaches the collapse-increasing voltage of the first element 1, the drain voltage is prevented from increasing further. Therefore, even if surge voltage due to electrostatic discharge etc. is applied to the semiconductor device 100, the first element 1 is prevented from increase in collapse and breakdown. As a result, the semiconductor device 100 becomes a device having high breakdown tolerance.

Figure 4:
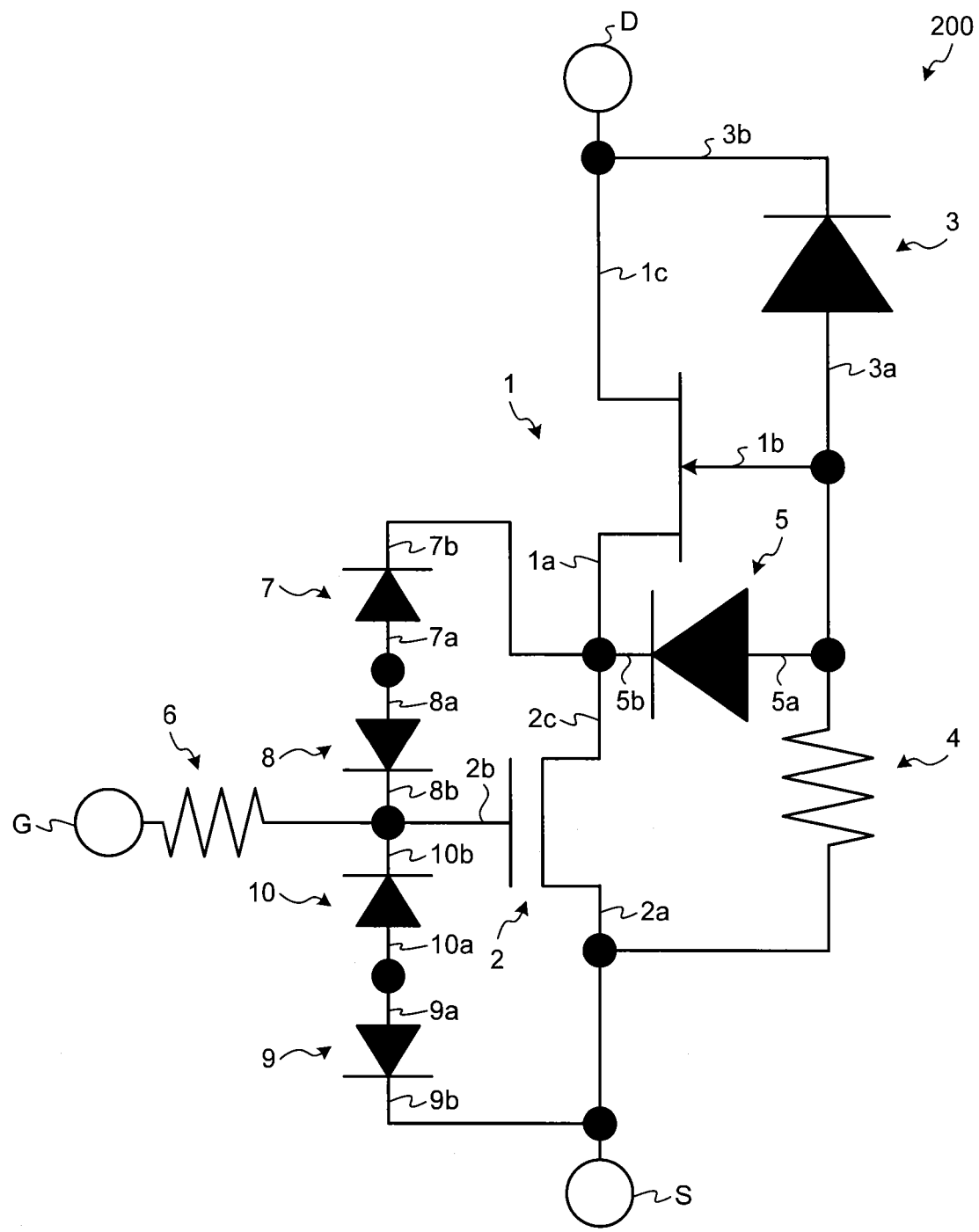
FIG. 4 is a circuit diagram of a semiconductor device according to an embodiment 2.

FIG. 4 is a circuit diagram of a semiconductor device according to an embodiment 2 of the present invention. As shown in FIG. 4, a semiconductor device 200 has a configuration in which, a second resistance 6, a second diode 7, and protection diodes 8, 9, 10 are added to the configuration of the semiconductor device 100 shown in FIG. 1.

The second resistance 6 is connected to the gate electrode 2b of the second element 2 and the gate terminal G of the semiconductor device 200. The second diode 7 includes an anode electrode 7a and a cathode electrode 7b. The second diode 7 is connected between the gate electrode 2b and the drain electrode 2c of the second element 2 so that the cathode electrode 7b is connected at the drain electrode 2c's side. The second diode 7 has predetermined avalanche withstand voltage. The second diode 7 is a P-N junction diode or a Schottky diode, but is not limited specifically.

The protection diodes 8, 9, 10 include anode electrodes 8a, 9a, 10a and cathode electrodes 8b, 9b, 10b respectively. The protection diode 8 is connected between the gate electrode 2b of the second element 2 and the second diode 7 so that the anode electrode 8a is connected at the anode electrode 7a's side. The protection diode 9 is connected between the gate electrode 2b and the source electrode 2a of the second element 2 so that the cathode electrode 9b is connected at the source electrode 2a's side. The protection diode 10 is connected between the gate electrode 2b of the second element 2 and the protection diode 9 so that the anode electrode 10a is connected at the anode electrode 9a's side.

Similarly to the case of the semiconductor device 100, when reverse voltage is applied between the source terminal S and the drain terminal D of the semiconductor device 200, and when anode-cathode voltage of the first diode 3 exceeds avalanche withstand voltage, the first diode 3 breaks down and avalanche current flows from the cathode electrode 3b to the anode electrode 3a, and after that, gate voltage due to the first resistance 4 is applied to the gate electrode 1b of the first element 1, thus, the first element 1 turns into on-state.

In the case of the semiconductor device 200, when the first element 1 turns into on-state, reverse voltage is applied between the anode electrode 7a and the cathode electrode 7b of the second diode 7. After that, when anode-cathode voltage of the second diode 7 exceeds avalanche withstand voltage, the second diode 7 breaks down, and avalanche current flows from the cathode electrode 7b to the anode electrode 7a. The avalanche current flows also to the second resistance 6 which is a gate resistance for the second element 2. Then, gate voltage due to the second resistance 6 is applied to the gate electrode 2b of the second element 2, and the second element 2 turns into on-state. In this way, the source potential of the first element 1 approaches gate potential, and the first element 1 turns into on-state, thus, electric current flows. As a result, higher reverse voltage is not applied between the source and the drain of the first element 1. It should be noted that the protection diode 9 functions to prevent gate current from flowing when the gate voltage of the second element 2 becomes positive relative to source voltage. The protection diodes 8 and 10 are diodes for protecting the second diode 7 and the protection diode 9 respectively.

In the semiconductor device 200 according to the present embodiment 2, similarly to the semiconductor device 100, the first diode 3 breaks down before drain voltage reaches the collapse-increasing voltage of the first element 1, and the drain voltage is prevented from increasing further. Therefore, even if surge voltage due to electrostatic discharge etc. is applied to the semiconductor device 200, the first element 1 is prevented from increase in collapse and breakdown. As a result, the semiconductor device 200 becomes a device having high breakdown tolerance.

Furthermore, as described above, in the semiconductor device 100, the source-drain of the second element 2 breaks down, thus, electric current flows between the source and the drain. In contrast to this, in the semiconductor device 200, since the second element 2 turns into on-state and electric current flows between the source and the drain, it is possible to flow a greater amount of electric current. It should be noted that, in order to achieve the above described operation, the avalanche withstand voltage of the second diode 7 is set to be lower than the avalanche withstand voltage between the source and the drain of the second element 2. For example, if the withstand voltage of the source and the drain of the second element 2 is 30 V, the avalanche withstand voltage of the second diode 7 is lower than 30 V.

Figure 5:
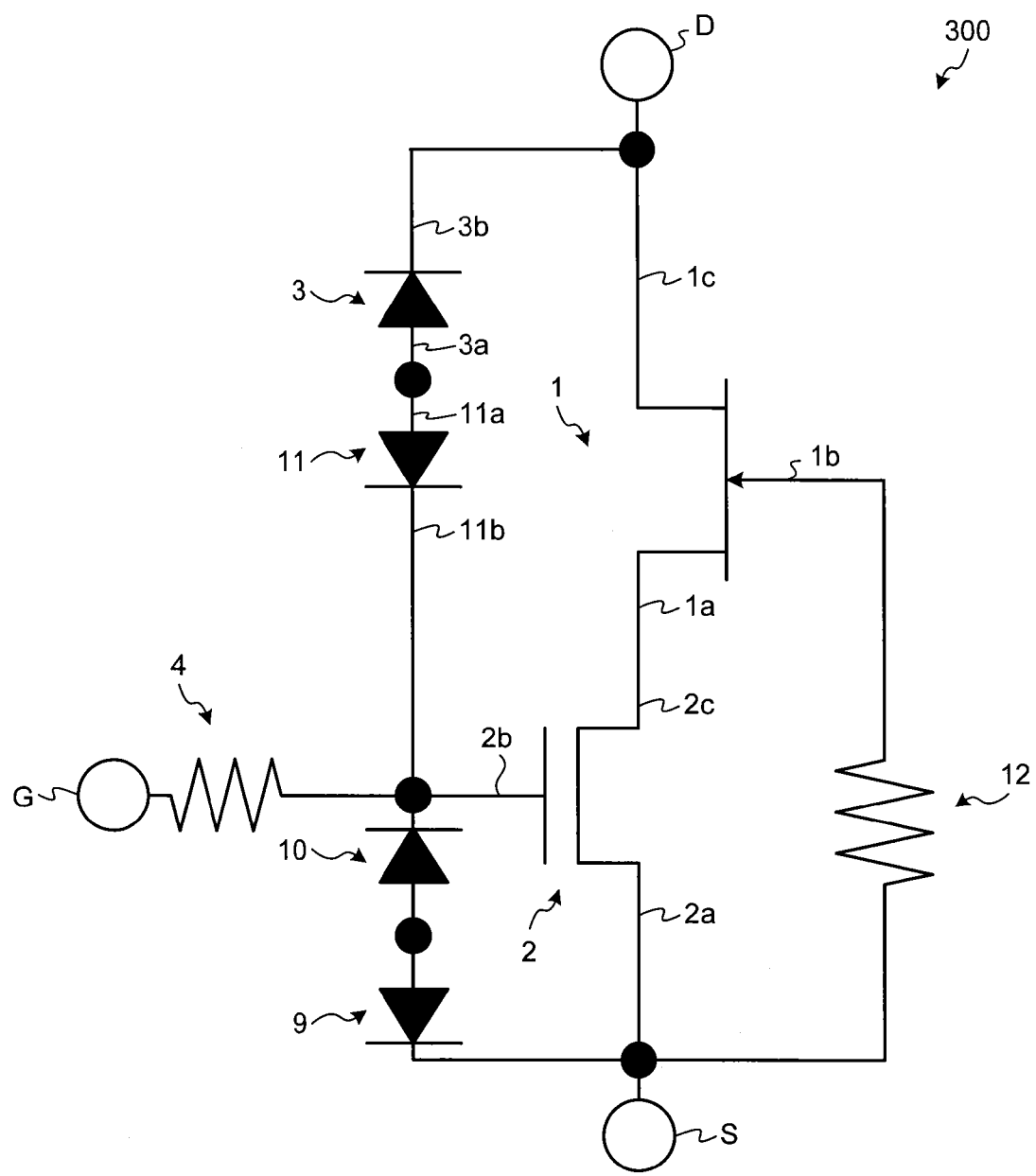
FIG. 5 is a circuit diagram of a semiconductor device according to an embodiment 3.

FIG. 5 is a circuit diagram of a semiconductor device according to an embodiment 3 of the present invention. As shown in FIG. 5, a semiconductor device 300 has a configuration in which, in the configuration of the semiconductor device 100 shown in FIG. 1, connection positions of the first diode 3 and the first resistance 4 are modified, the protection diode 5 is deleted, and a third resistance 12 and protection diodes 9, 10, 11 are added.

The first diode 3 is connected between the gate electrode 2b of the second element 2 and the drain electrode 1c of the first element 1 so that the cathode electrode 3b is connected at the drain electrode 1c's side. Also, the first resistance 4 is connected to the gate electrode 2b of the second element 2 and the gate terminal G of the semiconductor device 200.

The third resistance 12 is connected between the gate electrode 1b of the first element 1 and the source electrode 2a of the second element 2, and functions as a gate resistance with respect to the first element 1 in a cascode connection. The protection diode 11 includes an anode electrode 11a and a cathode electrode 11b and is connected between the gate electrode 2b of the second element 2 and the first diode 3 so that the anode electrode 11a is connected at the anode electrode 3a's side. The protection diodes 9, 10 are connected at positions similar to those of the protection diodes 9, 10 in the semiconductor device 200 shown in FIG. 4.

When reverse voltage is applied to an interval between a source terminal S and a drain terminal D of the semiconductor device 300, the first diode 3 breaks down when the anode-cathode voltage of the first diode 3 exceeds avalanche withstand voltage, avalanche current flows from the cathode electrode 3b to the anode electrode 3a. After that, gate voltage due to the first resistance 4 is applied to the gate electrode 2b of the second element 2, and the second element 2 turns into on-state. As a result, higher reverse voltage is not applied between the source and the drain of the first element 1. It should be noted that the protection diode 9 functions to prevent gate current from flowing when the gate voltage of the second element 2 becomes positive relative to source voltage. The protection diodes 11 and 10 are diodes for protecting the first diode 3 and the protection diode 9 respectively.

In the semiconductor device 300 according to the present embodiment 3, the first diode 3 breaks down before drain voltage reaches the collapse-increasing voltage of the first element 1, thus, the drain voltage is prevented from increasing further. Therefore, even if surge voltage due to electrostatic discharge etc. is applied to the semiconductor device 300, the first element 1 is prevented from increase in collapse and breakdown. As a result, the semiconductor device 300 becomes a device having high breakdown tolerance.

In the semiconductor device 300 according to the above described embodiment 3, in order to prevent overloading of the first diode 3 or downsize the first diode 3, it is preferable to set the resistance value, of the first resistance 4 which is a gate resistance, to be as high as possible. For example, if the avalanche current flowing in the first diode 3 is set at 100 mA, the resistance value of the first resistance 4 must be set to cause the second element 2 to be turn into on-state with this avalanche current. For example, in order to realize voltage drop, of equal to or greater than 10 V, of the first resistance 4 when 100 mA of the avalanche current flows, the resistance value of the first resistance 4 is set at, equal to or greater than, 100Ω.

On the other hand, in order to accelerate switching speed of the semiconductor device 300, it is preferable to lower the resistance value of the first resistance 4 to reduce parasitic effect by parasitic capacitance. For example, in order to make voltage drop of the first resistance 4 equal to or greater than 10 V when the resistance value of the first resistance 4 is 10Ω, the avalanche current flowing in the first diode 3 is set at equal to or greater than 1 A.

As described above, although the speed of a gate signal decreases when the resistance value of the first resistance 4 is high, but since a signal delayed by the decreased speed is amplified by the second element 2, minimum influence will be exerted on the switching operation of the first element 1. That is, the resistance value for determining the speed of switching operation in the entire configuration of the semiconductor device 300 according to the embodiment 3 is determined by the first resistance 4 and the third resistance 12. Therefore, even if the resistance value of the first resistance 4 increases, it is possible to restrain lowering of the switching speed of the entire semiconductor device 300 by lowering the resistance value of the third resistance 12.

It should be noted that the semiconductor device 100 according to the embodiment 1 is configured to not insert a gate resistance between the gate terminal G connected at a gate-driving circuit's side and the gate electrode 2b of the second element 2. Therefore, from the side of the gate-driving circuit, in case of driving the semiconductor device 100, as compared with the case of driving a single HEMT, there is no particular change except for that an element to be driven is modified from HEMT to the second element 2 which is a MOSFET, and thus operates normally off. Therefore, the semiconductor device 100 is more suitable for high speed operation.

In actually driven state of the semiconductor device 100, the first resistance 4 connected to the gate electrode 1b of the first element 1 which is HEMT affects the switching speed of the device. However, since the gate potential of the first element 1 is originally equal to source potential, voltage change at the time of switching operation of the semiconductor device 100 is conducted by potential change of the source potential of the first element 1. Since charge and discharge of electric current accompanying the change in the source potential are conducted through a channel of the first element 1 or the second element 2, the resistance value of the first resistance 4 hardly affects the switching characteristics of the semiconductor device 100 directly in this situation. As described above, the switching speed in the cascode connection of MOSFET and HEMT is controlled by a gate resistance of the MOSFET and a gate resistance of the HEMT but does not depend on the gate resistance of the HEMT entirely.

Also, in the case of the semiconductor device 200 according to the embodiment 2, since the second diode 7 may be a low withstand voltage diode, it is possible to increase avalanche current. As a result, since the reference value of the second resistance 6 can be decreased, it is suitable for high speed operation. For example, if the avalanche withstand voltage of the first diode 3 is 600 V and the withstand voltage between the source and the drain of the second element 2 is 30 V, the avalanche withstand voltage of the second diode 7 may be lower than about 30 V. Therefore, as compared with the configuration like that of the embodiment 3 in which the first diode 3 is inserted between the gate electrode 2b of the second element 2 and the drain electrode 1c of the first element 1, it turns out that the value of the avalanche withstand voltage of the second diode 7 may be smaller than one-twentieth. This indicates that, if a same size of diode is used, electric current greater than twenty times that of electric current when using the first diode 3 can be flowed. As a result, the gate resistance can be reduced to one-twentieth, and thus the gate resistance can be reduced to a great extent substantially and high speed switching becomes possible. Therefore, control range of switching speed by the gate resistance can be broadened to a great extent.

The above-described first diode 3 or the second diode 7 may be configured by a chip other than a chip of the first element 1 or the second element 2. The first diode 3 or the second diode 7 also may be formed on a chip including the first element 1 or the second element 2 in monolithic manner. In this case, each diode is formed with, for example, polysilicon on a chip.

Figure 6:
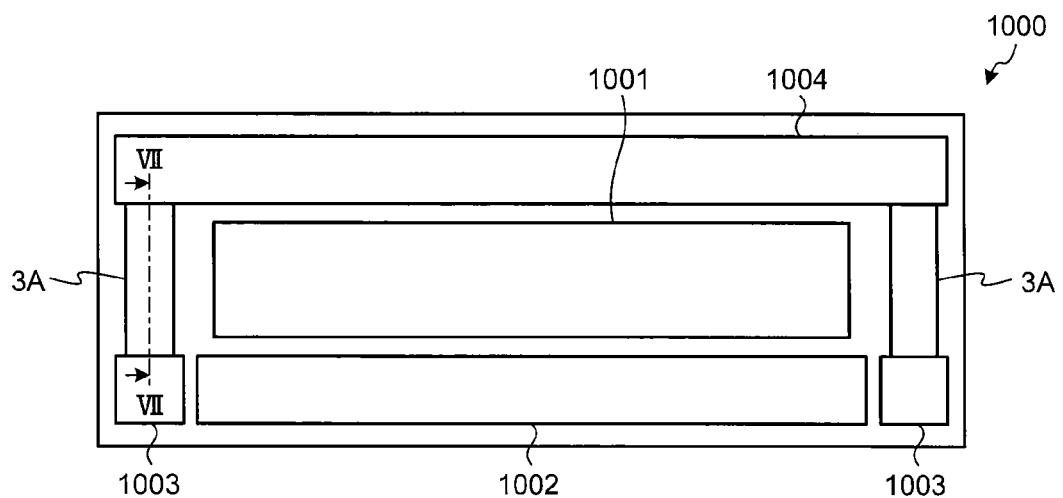
FIG. 6 is a view of a configuration in case of forming a diode on a chip.
Figure 7:
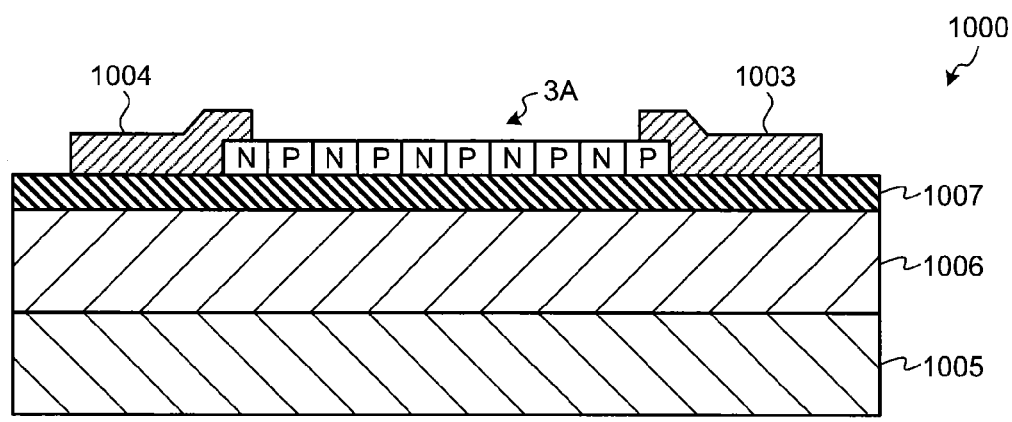
FIG. 7 is a cross sectional view taken along a line VII-VII in FIG. 6.

FIG. 6 is a view of a configuration of forming a diode on a chip. FIG. 7 is a cross sectional view taken along a line VII-VII in FIG. 6. A chip 1000 shown in FIG. 6 includes an active portion 1001 in which the first element 1 or the second element 2 is formed, and a source pad 1002, a gate pad 1003, and a drain pad 1004, connected to a source electrode, a gate electrode, and a drain electrode of an element formed in the active portion 1001 respectively.

Furthermore, as shown in FIG. 7, the chip 1000 includes a substrate 1005 above which the elements will be formed, a nitride-based compound semiconductor layer 1006 formed on the substrate 1005 and in which the elements are formed, and an insulating film 1007 formed on the nitride-based compound semiconductor layer 1006.

Herein, as shown in FIGS. 6 and 7, a P-N junction diode 3A which is the first diode 3 or the second diode 7 is formed on the insulating film 1007 of the chip 1000 in monolithic manner so that the P-N junction diode 3A connects the gate pad 1003 to the drain pad 1004. The P-N junction diode 3A has a configuration in which a plurality of P-N junction diodes formed with poly-silicon are connected in series. In case of such a configuration, since wire bonding for electric connection becomes fewer, there is an advantage of reducing pad area or assembly process.

Figure 8:
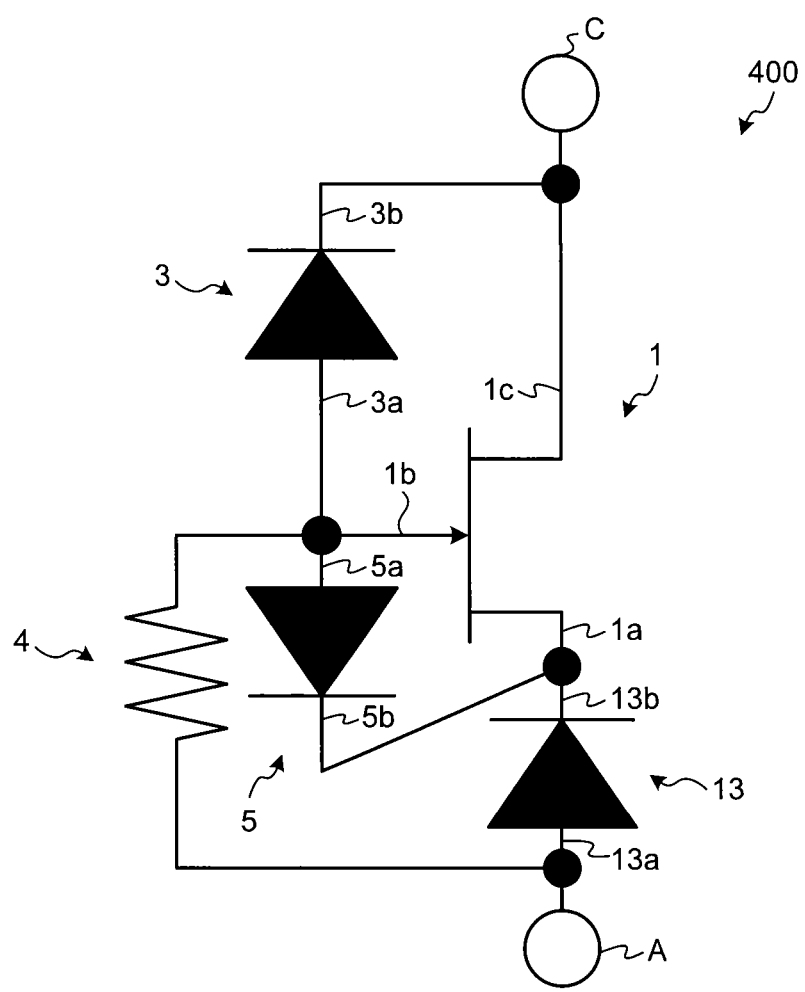
FIG. 8 is a circuit diagram of a semiconductor device according to an embodiment 4.

FIG. 8 is a circuit diagram of a semiconductor device according to an embodiment 4 of the present invention. As shown in FIG. 8, a semiconductor device 400 has a configuration which, in the configuration of the semiconductor device 100 shown in FIG. 1, replaced the second element 2 with a second element 13, replaced the source terminal S and the drain terminal D with an anode terminal A and a cathode terminal C respectively, and deleted the gate terminal G.

The second element 13 is, for example, a P-N junction type or SBD type diode and includes an anode electrode 13a and a cathode electrode 13b. The second element 13 is a low withstand voltage element of which withstand voltage between the anode and the cathode is equal to or lower than, for example, 50 V and is lower than withstand voltage of the first element 1. The cathode electrode 13b is connected to the source electrode 1a of the first element 1 and the cathode electrode 5b of the protection diode 5. As described above, the first element 1 and the second element 13 are connected in series. Also, the first resistance 4 is connected to an interval between the gate electrode 1b, which is a gate electrode to which the first diode 3 is connected, of the first element 1 and the anode electrode 13a of the second element 13. The anode electrode 13a is further connected to the anode terminal A. The cathode terminal C is connected to the drain electrode 1c of the first element 1.

As described above, the semiconductor device 400 includes a configuration of a cascode connection in which the first element 1 and the second element 13 are connected in series and the gate electrode 1b of the first element 1 and the anode electrode 13a of the second element 13 are connected, and functions as a cascode diode.

When reverse voltage is applied between the anode terminal A and the cathode terminal C of the semiconductor device 400, and if the anode-cathode voltage of the first diode 3 exceeds avalanche withstand voltage, the first diode 3 breaks down, and avalanche current flows from the cathode electrode 3b to the anode electrode 3a. The avalanche current flows also to the first resistance 4 which is a gate resistance. Then, voltage drop occurs due to the first resistance 4, and gate voltage is applied to the gate electrode 1b of the first element 1. When the gate voltage becomes equal to or greater than a threshold, the first element 1 turns into on-state. Since, in this state, the protection diode 5 is connected between the gate electrode 1b and the source electrode 1a, forward current is not to flow in the gate electrode 1b.

When the first element 1 turns into on-state as described above, reverse voltage applied between the anode and the cathode of the second element 13 increases, the second element 13 breaks down between the anode and the cathode, and thus, electric current flows. As a result, higher reverse voltage is not applied between the source and the drain of the first element 1.

In the semiconductor device 400, the avalanche withstand voltage of the first diode 3 is set to be lower than breakdown voltage and the collapse-increasing voltage of the first element 1. As a result, even if reverse voltage is applied to the semiconductor device 400, the first diode 3 breaks down before voltage greater than the collapse-increasing voltage is applied to the first element 1, and the second element 2 also breaks down, thus, reverse voltage greater than the collapse-increasing voltage is not applied between the source and the drain of the first element 1. Therefore, even if surge voltage due to electrostatic discharge etc. is applied to the semiconductor device 400, the first element 1 is prevented from increase in collapse and breakdown. As a result, the semiconductor device 400 becomes a device having high breakdown tolerance.

It should be noted that, if the second element 13 is SBD type, it is preferable because on resistance is low. On the other hand, if the second element 13 is P-N junction type, it is preferable because leakage current is low.

As described above, the semiconductor device according to the present invention is useful for power converter apparatuses such as inverters or power supply apparatuses in various industrial machines for which reliability such as breakdown tolerance is required to a great extent, and power semiconductor devices used in a circuit etc., into which a great surge may enter easily, such as igniters for conducting fuel control to engines.

It should be noted that, in the above described embodiments, although the avalanche withstand voltage of the first diode is lower than the collapse-increasing voltage of the first element, the present invention is not limited to this and the breakdown tolerance of the semiconductor device becomes high and the reliability of the semiconductor device becomes high if the avalanche withstand voltage of the first diode is lower than the breakdown voltage of the first element.

Although the first element is HEMT in the above described embodiments, the first element is not limited specifically if the first element is a normally-on transistor, and may be, for example, a Junction FET (JFET).

Also, it should be noted that the above-described embodiments do not limit the present invention. The present invention includes a configuration in which the above-described elements are combined preferably.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor device, comprising:
    a first element which is a normally-on type transistor made of nitride-based compound semiconductor, the first element being a gallium nitride-high electron mobility transistor (GaN-HEMT) or a junction field effect transistor (FET);
    a second element connected to the first element in series and being a transistor having withstand voltage between a source and a drain which is lower than withstand voltage of the first element;
    a first diode connected between a gate of the first element or a gate of the second element and a drain of the first element so that a cathode of the first diode is connected at the drain's side, an anode of the first diode is directly connected to the gate of the first element, and the first diode having predetermined avalanche withstand voltage;
    a first resistance connected to the gate to which the first diode is connected, wherein the avalanche withstand voltage of the first diode is lower than breakdown voltage of the first element, the first diode is connected to the gate of the first element, and the first resistance is connected to the gate of the first element and the source of the second element; and
    a protection diode, a cathode of the protection diode being connected to a source of the first element and the drain of the second element, and an anode of the protection diode being connected to the first resistance and directly connected to the anode of the first diode.

2. The semiconductor device according to claim 1, wherein the avalanche withstand voltage of the first diode is lower than collapse-increasing voltage of the first element.

3. The semiconductor device according to claim 1, wherein the first diode is formed in monolithic manner on a chip including the first element.

* * * * *